(12) United States Patent
Johnson et al.

(10) Patent No.: US 7,736,724 B1
(45) Date of Patent: Jun. 15, 2010

(54) FABRICATION OF NANOBASKETS BY SPUTTER DEPOSITION ON POROUS SUBSTRATES AND USES THEREOF

(75) Inventors: Paige Lea Johnson, Collinsville, OK (US); Dale Teeters, Sand Springs, OK (US)

(73) Assignee: The University of Tulsa, Tulsa, OK (US)

( * ) Notice: Subject to any disclaimer, the term of this patent is extended or adjusted under 35 U.S.C. 154(b) by 1069 days.

(21) Appl. No.: 11/383,146

(22) Filed: May 12, 2006

Related U.S. Application Data

(60) Provisional application No. 60/681,222, filed on May 13, 2005.

(51) Int. Cl.
*B32B 23/02* (2006.01)
*B32B 3/08* (2006.01)
*B32B 5/16* (2006.01)

(52) U.S. Cl. .................. 428/192; 428/194; 428/307.3; 428/312.2; 428/403; 428/404; 427/115; 977/743

(58) Field of Classification Search ................ 428/192, 428/194, 209, 210, 304.4, 306.6, 307.3, 307.7, 428/312.2, 364, 402, 402.2, 403, 404; 427/115; 977/700, 771, 742, 733
See application file for complete search history.

(56) References Cited

U.S. PATENT DOCUMENTS

| 6,042,959 | A | 3/2000 | Debe et al. |
| 6,197,450 | B1 | 3/2001 | Nathan et al. |
| 6,387,560 | B1 | 5/2002 | Yadav et al. |
| 6,586,133 | B1 | 7/2003 | Teeters et al. |
| 6,940,086 | B2 | 9/2005 | Gole et al. |
| 2002/0009632 | A1 | 1/2002 | Kim et al. |

OTHER PUBLICATIONS

F. A. Miranda et al., Electrical response of ferroelectric/superconducting/dielectric BaxSr1-xTiO3/YBa2Cu3O7-d/LaAlO3 thin-film multilayer structures, Superconductor Science and Technology, 8, p. 755-7763, No month 1995.*
Leng et al., Structural and optical properties of BaxSr1-xTiO3 thin films on indium tin oxide/quartz substrates prepared by radio-frequency magnetron sputtering, Journal of Applied Physics, 99, p. 114904, Jun. 2006.*
Gudiksen et al., Growth of nanowire superlattice structures for nanoscale photonics and electronics, Nature, 415, p. 617-620, Feb. 2002.*

(Continued)

*Primary Examiner*—Timothy M Speer
(74) *Attorney, Agent, or Firm*—Head, Johnson & Kachigian, P.C.

(57) ABSTRACT

A method of producing a nanobasket and the applications or uses thereof. The method includes the steps of providing a substrate with at least one (1) pore having diameters of about one (1) nanometer to about ten (10) micrometers. Material is deposited by sputter-coating techniques along continuous edges of the pores to form a capped or partially capped nanotube or microtube structure, termed a nanobasket. Either a single material may be used to form nanobaskets over the pores or, alternately, a layered structure may be created wherein an initial material is deposited followed by one or more other materials to form nanobaskets over the pores.

20 Claims, 14 Drawing Sheets

OTHER PUBLICATIONS

Bunshah, Rointan F., "Handbook of Deposition Technologies for Films and Coatings: Science Technology and Applications", 2nd Ed., Noyes Publications, 1994.

Elena D. Mishina et al., "Ferroelectric Nanostructures Sputtered On Alumina Membranes", Physica E., 25 (2004) 35-41, Sep. 2004.

Vovk, A., et al., "Preparation Structural Characterization, and Dynamic Properties Investigation of Permalloy Antidot Arrays", J. Appl. Phys., 97, 10J506 (2005), May 2005.

Qui, Limin, Na. Jiming et al., "Synthesis and Characterization of Mesostructured Tin Oxide with Crystalline Walls", Langmuir, 14(9) 2579-2581 (1998), Mar. 1998.

P. Johnson and D. Teeters, Solid State Ionics (2006) in press.

H. Masuda, K. Nishio and N. Baba, Thin Solids Films, 223, 1, (1993), "Preparation of Microporous Metal Membranes by Two-Step Replication of the Microstructure of Anodic Alumina", 1993.

H. Masuda and K. Fukuda, Science, 268, 1466 (1995), "Ordered Metal Nanohole Arrays Made by a Two-Step Replication of Honeycomb Structures of Anodic Alumina", Jun. 9, 1995.

A.-P. Li, F. Muller, A. Birner, K. Neilsch, and U Gosele, Adv. Mater. 11, 483 (1999), "Fabrication and Microstructuring of Hexagonally Ordered Two-Dimensional Nanopore Arrays in Anodic Alumina", 1999.

I. Mikulska, S. Juodkazis, R. Tomasiunas, and J. G. Dumas, Adv. Mater. 13, 1574 (2001), "Aluminum Oxide Photonic Crystals Grown by a New Hybrid Method", Oct. 2001.

K. H. A. Lau, L.-S. Tan, K. Tanada, M. S. Sander, and W. Knoll, "Highly Sensitive Detection of Processes Occurring Inside Nanoporous Anodic Alumina Templates: A Waveguide Optical Study," Journal of Physical Chemistry, 108, 10812 (2004), Jul. 2004.

Seshumani Vorrey and Dale Teeters, "Study of the Ion Conduction of Polymer Electrolytes Confined in Micro and Nanopores," Electrochimica Acta, 48, 2137 (2003).

B.J. Neudecker, N.J. Dudney, and J.B. Bates, "Lithium-Free Thin-Film Battery with in Situ Plated Li Anode," Journal of the Electrochemical Society, 147 517 (2000).

Y. Wang, et. al., Solid-State Electronics, 48 (2004) 627-632, May 2004.

P.Olivi, et al., J. Electrochem. Soc. L81 (1993) 140, May 1993.

Z. Fang, et. al., Materials Letters, 57 (2003) 4187-4190, Sep. 2003.

Abstracts of Papers, 222nd ACS National Meeting, Chicago, IL, United States, Aug. 26-30, 2001.

Park, Y.J., Park, K.S., Kim, J.G., Kim, M.K., Kim, H.G., Chung, H.T., J. Power Sources (2000) 88 (2), 250 (Month Unknown); "Characterization of Tin Oxide/LiMn2O4 Thin-Film Cell".

Park, Y.J., Kim, J.G., Kim, M.K., Kim, H.G., Chung, H.T., Park, Y., J. Power, Sources (2000) 87 (1-2), 69 (Month Unknown); "Electrochemical Properties of LiMn2O4 Thin Films: Suggestion of Factors for Excellent Rechargeability".

Levasseur, A., Vinatier, P., Gonbeau, D., Bull. Mater. Sci. (1999) 22 (3), 607. (May), "X-ray Photoelectron Spectroscopy: A Powerful Tool For a Better Characterization of Thin Film Materials".

Han, K.S., Tsurimoto, S., Yoshimura, M., Solid State Ionics (1999) 121 (1-4), 229. (Month Unknown); "Fabrication Temperature and Applied Current Density Effects on the Direct Fabrication of Lithium Nickel Oxide Thin-Film Electrodes in LiOH Solution by the Electrochemical-Hydrothermal Method".

Park, Y., Kim, J.G., Kim, M.K., Chung, H.T., Um, W.S., Kim, M.H., Kim, H.G., J. Power Sources (1998) 76 (1), 41. (Month Unknown), "Fabrication of LiMn2O4 Thin Films by Sol-Gel Method for Cathode Materials of Microbattery".

Lee, S.J., Lee, J.K., Kim, D.W., Baik, H.K., Lee, S.M., Journal of the Electrochemical Society (1996) 143 (11) L268-L270. (Nov.); "Fabrication of Thin Film LiCo0.5Ni0.5O2 Cathode for Li Rechargeable Microbattery", Nov. 1996.

Jones, S.D., Akridge, J.R., Solid State Ionics (1996) 86-8 Part 2 1291-1294. (Month Unknown); "A Microfabricated Solid-State Secondary Li Battery".

Kinoshita, K., Song, X., Kim, J., Inaba, M., Kim, J., Journal of Power Sources (1999) 82 170-175. (Month Unknown); "Development of a Carbon-Based Lithium Microbattery".

Binhar, H., Zuniga, B., and Teeters, D. "Lithium Polymer Battery Systems Using Poly(Chloroacetylene) Electrodes," presented at the 215th National Meeting of the American Chemical Society, Dallas, TX, Mar. 29-Apr. 2, 1998.

Nagatomo, T., Kakehata, H., Ichikawa, C., and Omoto, O., J. Electrochem. Soc., (1985) 132, 1380 (Jun.); "Large-Scale Polyacetylene Batteries", Jun. 1985.

Nagatomo, T., Kakehata, H., Ichikawa, C., and Omoto, O., Synth. Met., (1987) 18, 649, (Month Unknown); "Polyacetylene Batteries—Scaling Up and Problems".

Korzhova, N., Fisher, S.L., LeGranvalet-Mancini, M., Teeters, D. "Ionic Conduction in Polymer Electrolyte/Microporous Membrane Composites," presented at the Symposium on Polymers for Batteries and Fuel Cells, the 217th National Meeting of the American Chemical Society, Anaheim, CA, Mar. 21-25, 1999.

Alivisatos, A. P., J. Phys. Chem. (1996) 100 13226. (Month Unknown); "Perspectives on the Physical Chemistry of Semiconductor Nanocrystals".

Alivisatos, A. P., Science, (1996) 271 933. (Feb.); "Semiconductor Clusters, Nanocrystals, and Quantum Dots".

Leppert, V. J., Mahammuni, S., Kumbhojkar, N. R., Risbud, S. H. Materi Sci. Eng. B, 1998, 52 89. (Month Unknown); "Structural and Optical Characteristics of ZnSe Nanocrystals Synthesized in the Presence of a Polymer Capping Agent".

Bradley, J. S. in Cluster and Colloids from Theory to Applications, Schmid, G., Ed., VCH: Weinheim, 1994, Chapter 6 and reference therein. (Month Not Applicable); "The Chemistry of Transition Metal Colloids".

Yonezawa, T., Toshima, N., J. Chem. Soc., Faraday Trans. (1995) 91, 4111. (Month Unknown).

Toshima, N., Harada, M., Yamazake, Y., Asakura, K., J. Phys. Chem. (1992), 96, 9927. (Month Unknown); "Catalytic Activity and Structural Analysis of Polymer-Protected Au-Pd Bimetallic Clusters Prepared by the Simultaneous Reduction of HAuCl4 and PdCl2".

Esumi, K. Wakabayashi, M., Torigoe, K., Colloids Surf., (1996) 109 55. (Month Unknown); "Preparation of Colloidal Silver-Palladium Alloys by UV-Irradiation in Mixtures of Acetone and 2-Propanol".

Schaefer, D. M., Reifenberger, R., Patil, A., Samelson, L., Appl. Phys. Lett. (1995) 66 1012. (Feb.); "Fabrication of Two-Dimensional Arrays of Nanometer-Size Clusters with the Atomic Force Microscope".

Junno, T., Deppert, K., Montelius, L., Samuelson, L., Appl. Phys. Lett. (1995) 6 3627. (Jun.); "Controlled Manipulation of Nanoparticles with an Atomic Force Microscope".

Sheehan, P. Leiber, C. M., Science (1996) 272, 1158. (May); "Nanotribology and Nanofabrication of MoO3 Structures by Atomic Force Microscopy".

Baur, C., Gazen, B. C., Koel, B. E., Ramachandran, T. R., Requicha, A. A. G., Zini, L., J. Vac. Sci. Tehnol., B (1997) 15, 1577. (Jul./Aug.); "Robotic Nanomanipulation with a Scanning Probe Microscope in a Networked Computing Environment".

Brandow, S. L., Dressick, W. J., Dulcey, C. S., Koloski, T. S., Shirey, L. M., Schmidt, J., Calvert, J. M., J. Vac. Sci. Technol., B (1997) 15, 1818. (Sep./Oct.); "Nanolithography by Displacement of Catalytic Metal Clusters Using an Atomic Force Microscope Tip".

Ramachandran, T. R., Baur, C. Bugacov, A., Madhukar, A., Koel, B. E., Requicha, A. A. G., Gazen, B. C., Nanotechnology, (1998) 9, 237. (Month Unknown); "Direct and Controlled Manipulation of Nanometer-Sized Particles Using the Non-Contact Atomic Force Microscope".

Schindler, W., Hofmann, D., Kirschner, J., J. Appl. Phys. (2000) 87 7007. (May); "Nanoscale Electrodeposition: A New Route to Magnetic Nanostructures?".

Cepak, V. M., Martin, C. R., Chem. Mater. (1999) 11 1363. (Month Unknown); "Preparation of Polymeric Micro- and Nanostructures Using a Template-Based Deposition Method".

Anantram, M. P., Datta, S., Xue, Y., Phys. Rev. B (2000) 61 14219). (May); "Coupling of Carbon Nanotubes to Metallic Contacts".

Nonobatteries: Decreasing Size Power Sources for Growing Technologies; David A. Lowry and Adrian Patrut; Recent Patents on Nanotechnology 2008, 2, 208-219, 2008.

\* cited by examiner

FABRICATION OF NANOBASKETS BY SPUTTER DEPOSITION ON POROUS SUBSTRATES AND USES THEREOF

CROSS-REFERENCE TO RELATED APPLICATIONS

This application claims priority to U.S. Provisional Application Ser. No. 60/681,222.

STATEMENT REGARDING FEDERALLY SPONSORED RESEARCH OR DEVELOPMENT

This invention was made with U.S. Government support under the National Aeronautics and Space Administration Grant NCC-5-586 and the National Science Foundation contract EPS-0132534 awarded by NASA and the National Science Foundation. The U.S. Government has certain rights in the invention.

BACKGROUND OF THE INVENTION

1. Field of the Invention

The present invention is directed to fabrication of nanotube structures iii the form of nanobaskets by sputter deposition on porous substrates and their uses in various applications.

2. Prior Art

The potential of nanotechnology to provide new technological breakthroughs is the object of much current attention. Nanostructured materials have the potential for enhanced properties and efficiency improvements in virtually every area of science and technology through enhanced surface areas and quantum-scale reactions. This disclosure deals with the formation of novel nanoscale structures that have numerous potentially important applications.

An example of an application for nanotube structures is found in Assignee's U.S. Pat. No. 6,586,133 for "Nano-Battery Systems" issued Jul. 1, 2003. The patented disclosure is directed to nano-batteries and micro-batteries as well as their manufacture and use. Porous substrate technology is utilized wherein the substrate has a plurality of holes or pores that range in diameter between ten (10) micrometers to one (1) nanometer (nm).

Nanoscale or microscale deposition of particles by a sputtering process is also known. The process of sputtering may be defined as the ejection of particles from a condensed-matter target due to the impingement of energetic projectile particles. Operatively, the source of coating material, referred to as the target, is mounted opposite to the sample, in this case a porous substrate in a vacuum chamber. The most common method of generating ion bombardment is to backfill the evacuated chamber with a continual flow of gas and establish a glow discharge, indicating that ionization is occurring. A negative potential applied to the target causes it to be bombarded with positive-ions while the substrate is kept grounded. Impingement of the positive ion projectile results in ejection of target atoms or molecules and their deposition on the substrate.

One of the most useful characteristics of the sputtering process is its universality: virtually any material is a coating candidate. Sputtering systems assume an almost unlimited variety of configurations, depending on the desired application. DC discharge methods are often used for sputtering metals, while an RF potential is used for nonconducting materials. Ion-beam sources can also be used. Targets may be elements, alloys, or compounds, in either doped or undoped forms, and can be employed simultaneously or sequentially. The substrate may be electrically biased so that it too undergoes ion bombardment. A reactive gas may be used to introduce one of the coating constituents into the chamber, i.e. oxygen to combine with sputtered tin to form tin oxide (reactive sputtering). (Bunshah, Rointan F., "Handbook of Deposition Technologies for Films and Coatings: Science Technology and Applications", $2^{nd}$ Ed., Noyes Publications, 1994.)

A recent study of nanostructures fabricated by RF sputtering of barium strontium titanate (BST) on porous alumina substrates suggests that the sputtered material does not penetrate into pores. It has been observed that the deposited material preferentially gathers along the continuous circular edge of pore openings. (Elena D. Mishina et al., "Ferroelectric Nanostructures Sputtered On Alumina Membranes", *Physica E.*, 25 (2004) 35-41.

Another, similar study refers to this type of sputtered metal structure as "antidots." (Vovk, A., et al, "Preparation, structural characterization, and dynamic properties investigation of permalloy antidot arrays.", *J. Appl. Phys.*, 97, 10.1506 (2005)) These differ from the structures claimed in this patent, in that the structures are not partially or complete capped, nor are they layered, and they are formed only from metals. Nor were the "antidots" used to assemble any sort of device.

Nanotubes and other nanostructures may be formed as large arrays, and in this form are often referred to as nanoporous or mesoporous structures. "Meso-porous" tin oxide structures have been created using surfactant templating techniques. (Qui, Limin, Ma, Jiming, et. Al., "Sythesis and Characterization of Mesostructured Tin Oxide with Crystalline Walls", *Langmuir*, 14(9) 2579-2581, (1998)) The resultant material, however, consists of material containing irregular nanopores averaging about two (2) nm in size, without long-range order. It is markedly different from the invention claimed in this patent, which can be formed in large arrays of tunable pore sizes, which develops wall height as well as porosity, and which can be partially or completely capped to form the basket structure.

An additional unique aspect of the present invention is that it has been found to have a substructure of very small nanoparticles, i.e., the walls and caps of the basket are themselves composed of nanoparticles ten (10) nm and less in size. (P. Johnson and D. Teeters, Solid State Ionics (2006), in press) Numerous scientific studies attest to the importance of nanoparticulate grain size in performance characteristics of electronic, optical, and catalytic devices.

The use of sputter techniques to create partially or completely capped and/or layered nanotube structures is believed to be unique and opens a wide range of potential applications.

Accordingly, it would be desirable to produce a nanotube structure wherein at least one end of a nanotube is partially or completely closed or covered over so that the nanotube forms a nanobasket.

It would also be desirable to form a nanobasket by sputter deposition.

It would be desirable to form a large array of nanobaskets as a nanoporous architecture.

It would also be desirable to fabricate nanobaskets as a component of photovoltaic devices.

It would also be desirable to provide nanobaskets for use in battery systems.

It would also be desirable to provide nanobaskets for use as a catalytic device.

It would also be desirable to provide nanobaskets for use in optoelectronic devices.

It would also be desirable to provide nanobaskets for use in fuel cell assemblies.

It would also be desirable to provide nanobaskets for use as human bone mimics and tissue scaffolding.

SUMMARY OF THE INVENTION

The present invention is directed to the fabrication of and a process to form a nanoscale or microscale structure that includes capped or partially capped nano- or micro-tubes termed "nanobaskets" by a sputter-coating method. The use of these nanobaskets in various applications is also included within the present invention.

In one example, a substrate having a plurality of pores that range between ten (10) micrometers to one (1 nanometer in diameter may be employed.

The porous substrate could be made from various materials using several different techniques. One preferred substrate is a nanoporous anodized alumina oxide substrate. Other substrates could include nanoporous silicon, nanoporous metals, nanoporous ceramics or nanoporous polymers. It should be noted that the term "nanoporous" is used loosely in the nanotechnology field to designate something ranging from the ones of nanometers to the hundreds of nanometers in size.

The nanobasket structure is formed in accordance with the present invention using sputter-coating techniques. At the surface of the substrate, the pores have a continuous edge, which could be of any relative geometric configuration. As a target material is sputter-coated, nanoscale clusters of the material collect preferentially on the continuous edge of the pores of the underlying substrate. As the process of depositing material continues, it results in the gradual build-up of "walls" that effectively extend the pore structure with the target material. These walls grow thicker as they grow taller, and therefore if the sputter-coating process continues, they will eventually touch so that the pores are capped over with deposited material, forming the base or end of a basket. If the sputtering process is stopped before the walls have completely touched, a partially capped nanobasket results. The nanobaskets may be formed individually or as arrays, resulting in a nanoporous material with high surface area.

The process of the present invention also allows formation of nanobaskets of multiple compositions.

DETAILED DESCRIPTION OF THE PREFERRED EMBODIMENTS

The embodiments discussed herein are merely illustrative of specific manners in which to make and use the invention and are not to be interpreted as limiting the scope of the instant invention.

While the invention has been described with a certain degree of particularity, it is to be noted that many modifications may be made in the details of the invention's construction and the arrangement of its components without departing from the spirit and scope of this disclosure. It understood that the invention is not limited to the embodiments set forth herein for purposes of exemplification.

Figure 1:
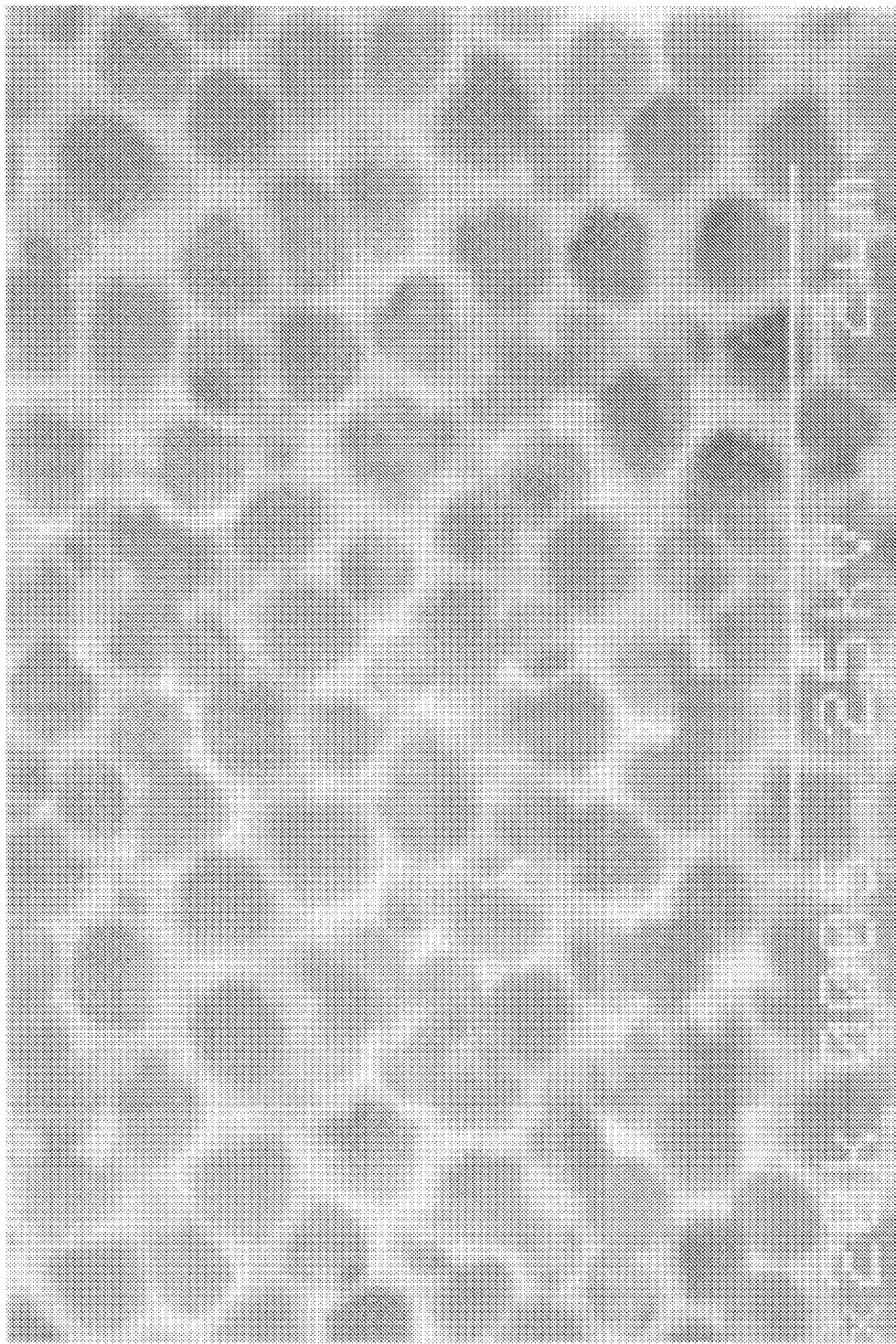
FIG. 1 illustrates an electron microscope photograph of a stage in the process of the fabrication of a nanobasket by sputter deposition on a porous substrate as set forth in the present invention.

Referring to the drawings in detail, FIG. 1 illustrates an electron microscope photograph of a stage in the process of the formation of a nanoscale structure that includes capped nanotubes, termed "nanobaskets" by a sputter-coating method. The present invention takes advantage of a porous substrate as the template for the structure. In one example, a substrate has a plurality of pores that range between ten (10) micrometers to one (1) nanometer (nm) in diameter. Various substrates could be used, e.g., either polymeric (such as poly carbonate) or ceramic material (such as alumina oxide ($Al_2O_3$)). Nanoporous substrates of silicon or metallic porous structures could also be used. The substrate includes pores that could be created by laser ablation, a chemical etching process, an electrochemical process, track etching, micro or nanolithography, contact lithography or by other methods. The length of the pores in the substrate itself has not been found to be critical to the nanobasket formation, and so could vary over any conceivable length range.

The nanoporous substrate could be made from numerous materials whose surface energy values are such that they are conducive to the formation of "nanobaskets."

The nanoporous substrate could be made using several techniques. One involves the use of nanoporous anodized aluminum oxide substrates. The process for making these substrates has been described in the literature (H. Masuda, K. Nishio and N. Baba, Thin Solids Films, 223, 1, (1993); H. Masuda and K. Fukuda, Science, 268, 1466 (1995); A.-P. Li, F. Muller, A. Bimer, K. Neilsch, and U Gosele, Adv. Mater. 11, 483 (1999); I. Mikulska, S. Juodkazis, R. Tomasiunas, and J. G. Dumas, Adv. Mater. 13, 1574 (2001)) and consists of applying an electrical potential to an aluminum sheet while in an acid solution. Micro and nanolithographic techniques and other techniques such as X-ray-beam, electron-beam and ion-beam lithography could be used. Microcontract printing could also be used to make the nanoporous substrate.

The nanobasket structure can be formed using sputter-coating techniques. This includes DC sputter-coating, RF sputter-coating and RF magnetron sputter-coating. Chemical reactive sputtering could also be used. The structure could also be formed using chemical vapor deposition or pulsed laser methods.

At the surface of the substrate, the pores have a continuous edge, which could be of any relative geometric configuration. As a target material is sputter-coated, nanoscale clusters of the material collect preferentially on the continuous edge of the pores of the underlying substrate. As the process of depositing material continues, it results in the gradual build-up of "walls" that effectively extend the pore structure with the target material to form a nanotube. The pore size of these nanotubes is dependent on the substrate's original pore structure and, therefore, their diameter can be varied by using substrates of varying pore sizes.

As the sputter-coating process is continued, it has been observed that the walls grow thicker as they grow taller so that they will eventually touch, capping over the pore spaces with deposited material to form the base or end of a basket. Depending on the parameters used in the sputter-coating process, such as plasma gas concentration, power, target materials, and underlying substrate, the pores can be made to cap at various lengths or heights from the substrate surface, ranging from tens to hundreds of nanometers. Capped nanoporous structures have hereto before been difficult to synthesize and have different potential application than open tubes.

Figure 2:
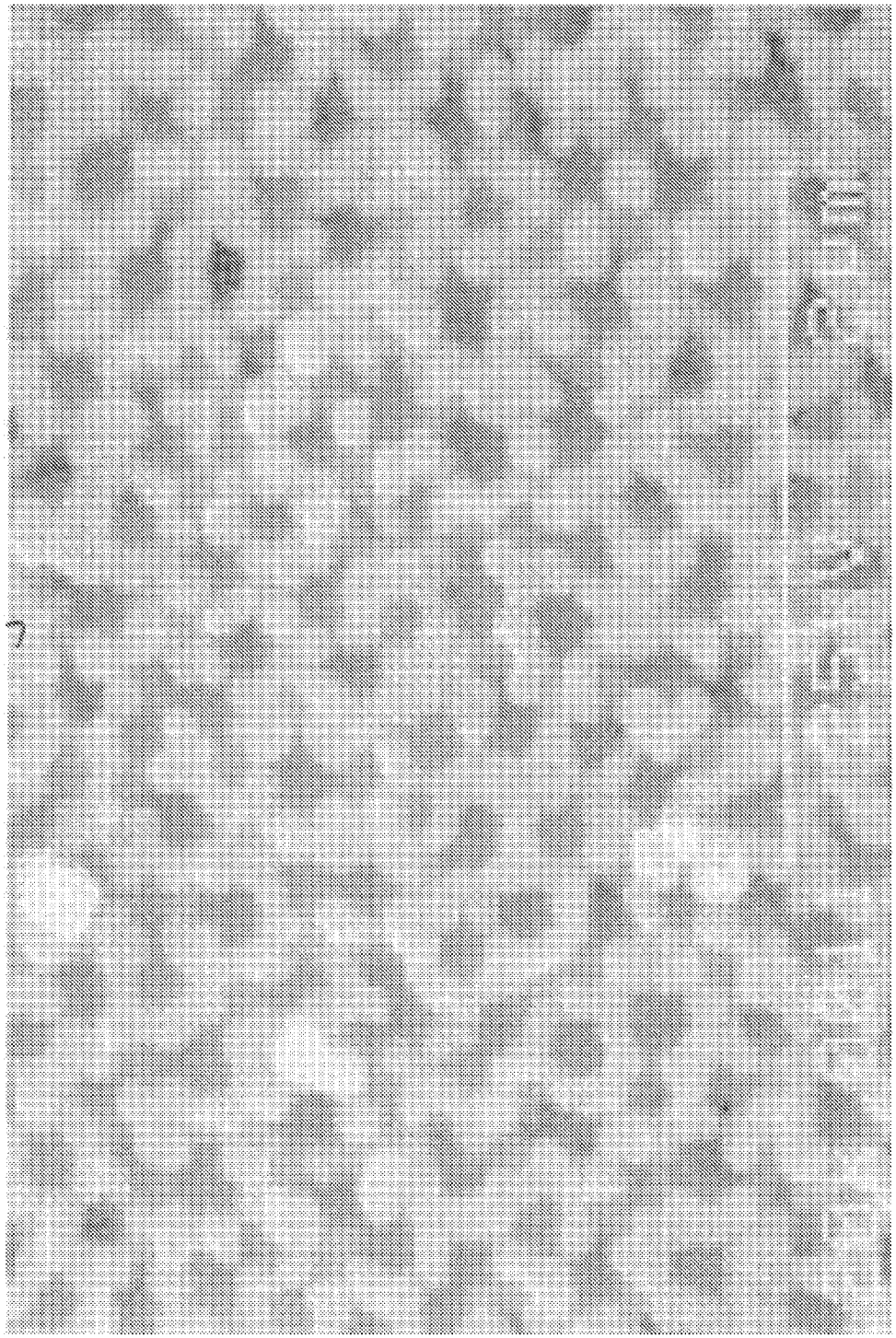
FIG. 2 illustrates a sequential stage in the process subsequent to that shown in FIG. 1.

FIG. 1 illustrates an electron microscope photograph of a stage in the process of the fabrication of a nanobasket by sputter deposition on a porous substrate as set forth in the present invention FIG. 2 illustrates an electron microscope photograph of approximately 400 nanometers of tin oxide sputtered onto an alumina substrate. It will be observed that the material is beginning to cap or close over.

Figure 3:
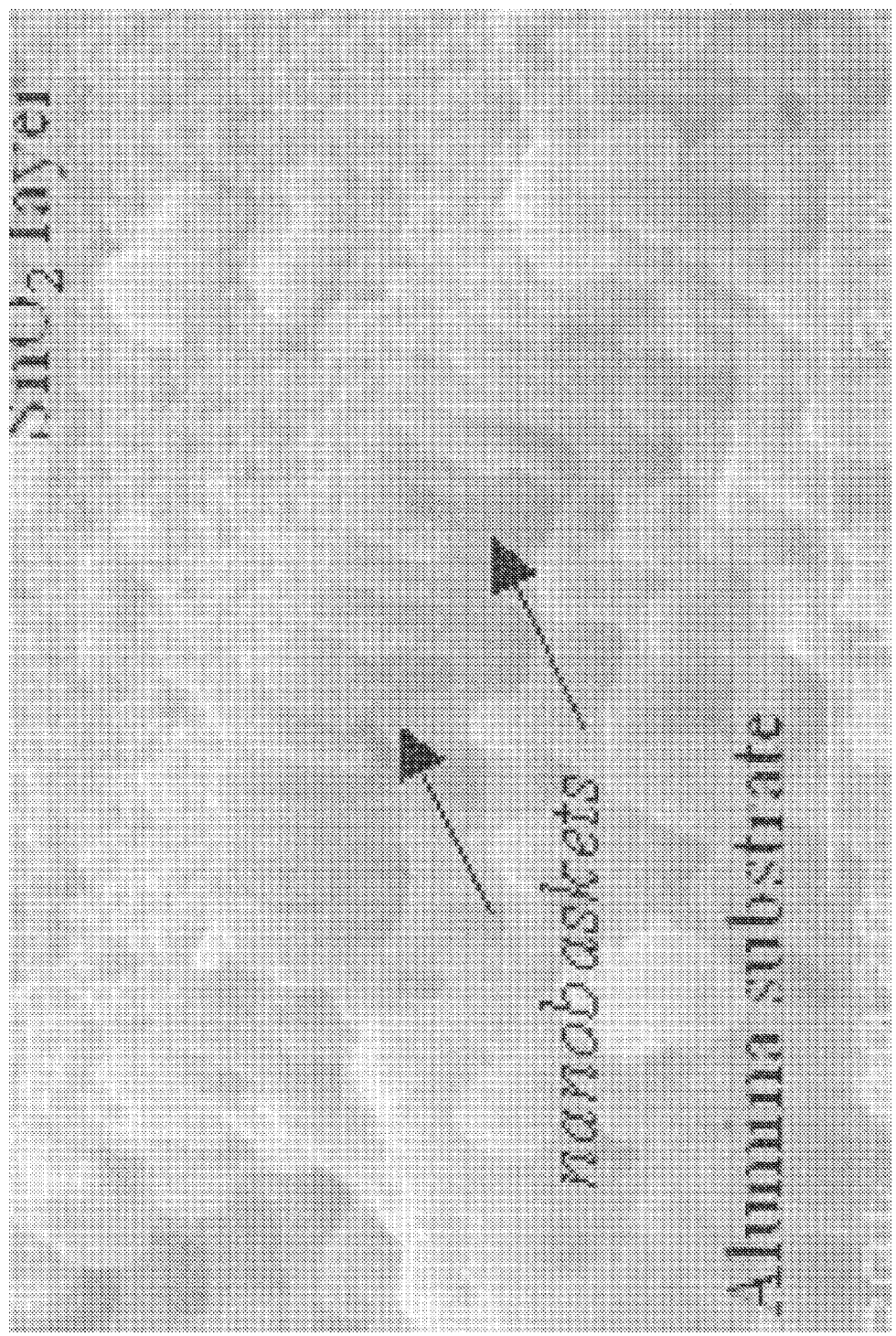
FIG. 3 illustrates a partial, sectional view elan electron microscope photograph of a further subsequent stage of the process.

FIG. 3 illustrates an electron microscope photograph of a partial cross-section of the photo shown in FIG. 2. The alumina substrate may be viewed with the tin oxide sputtered thereon to form the nanobaskets.

Figure 8:
FIG. 8 illustrates an electron microscope photograph of a sectional view of a partially capped nanobasket.

FIG. 8 is an electron microscope photograph that shows that as the structures begin to cap over very small nanochannels are formed that may also be of technical significance. Such nanochannels have potential applications in the trapping of molecular species, confinement of DNA and RNA, specialized filtrations, and chromatographic analysis. This would be one example of a "partially capped" structure. Partially capped structures are created by stopping the sputtering process before the walls of the nanobasket have grown together to form a continuous cap.

Figure 9:
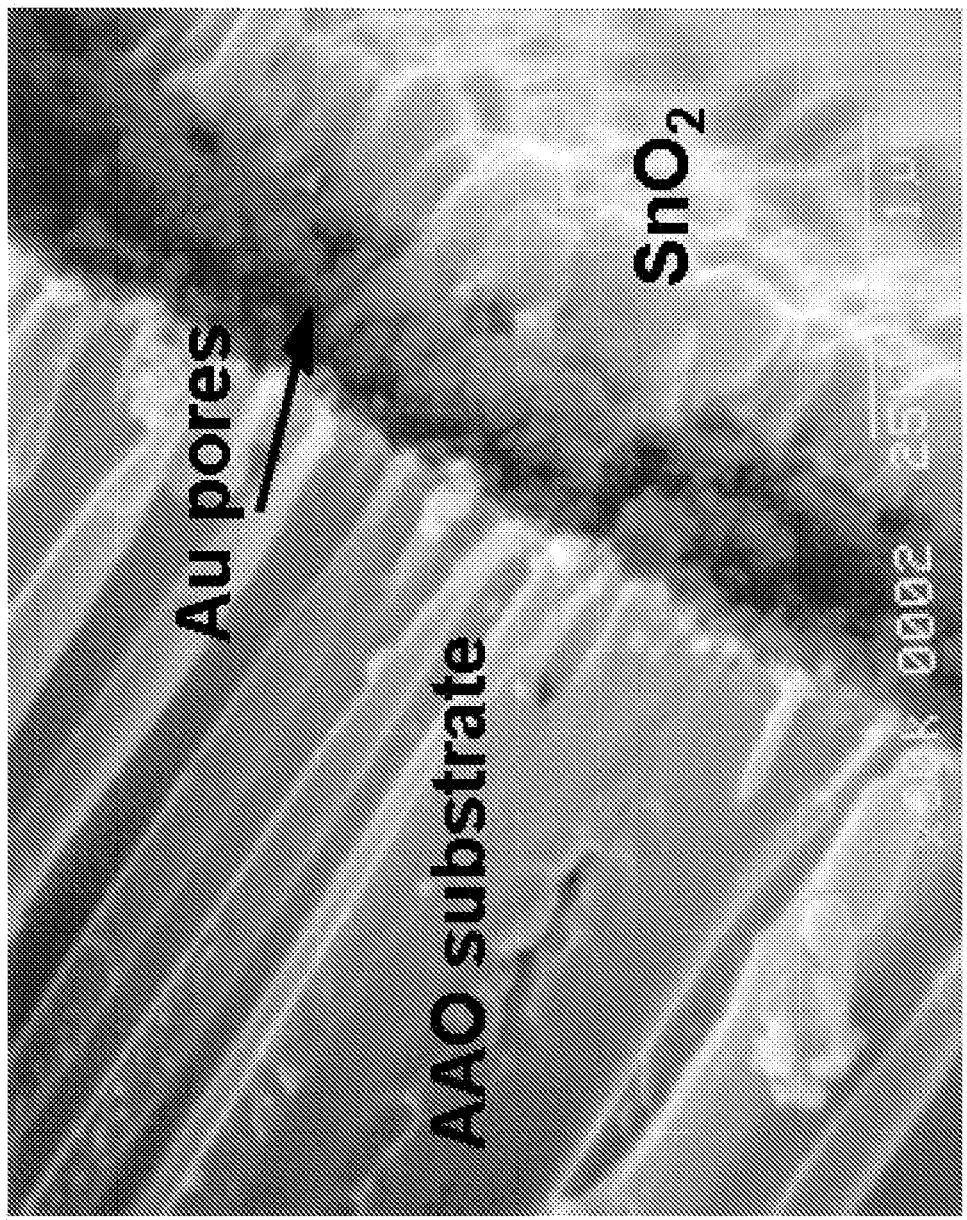
FIG. 9 illustrates an electron microscope photograph of a capped nanobasket utilizing multiple compositions to create a layered structure.

FIG. 9 illustrates an electron microscope photograph of a capped nanobasket utilizing multiple compositions to create a layered structure.

Figure 14:
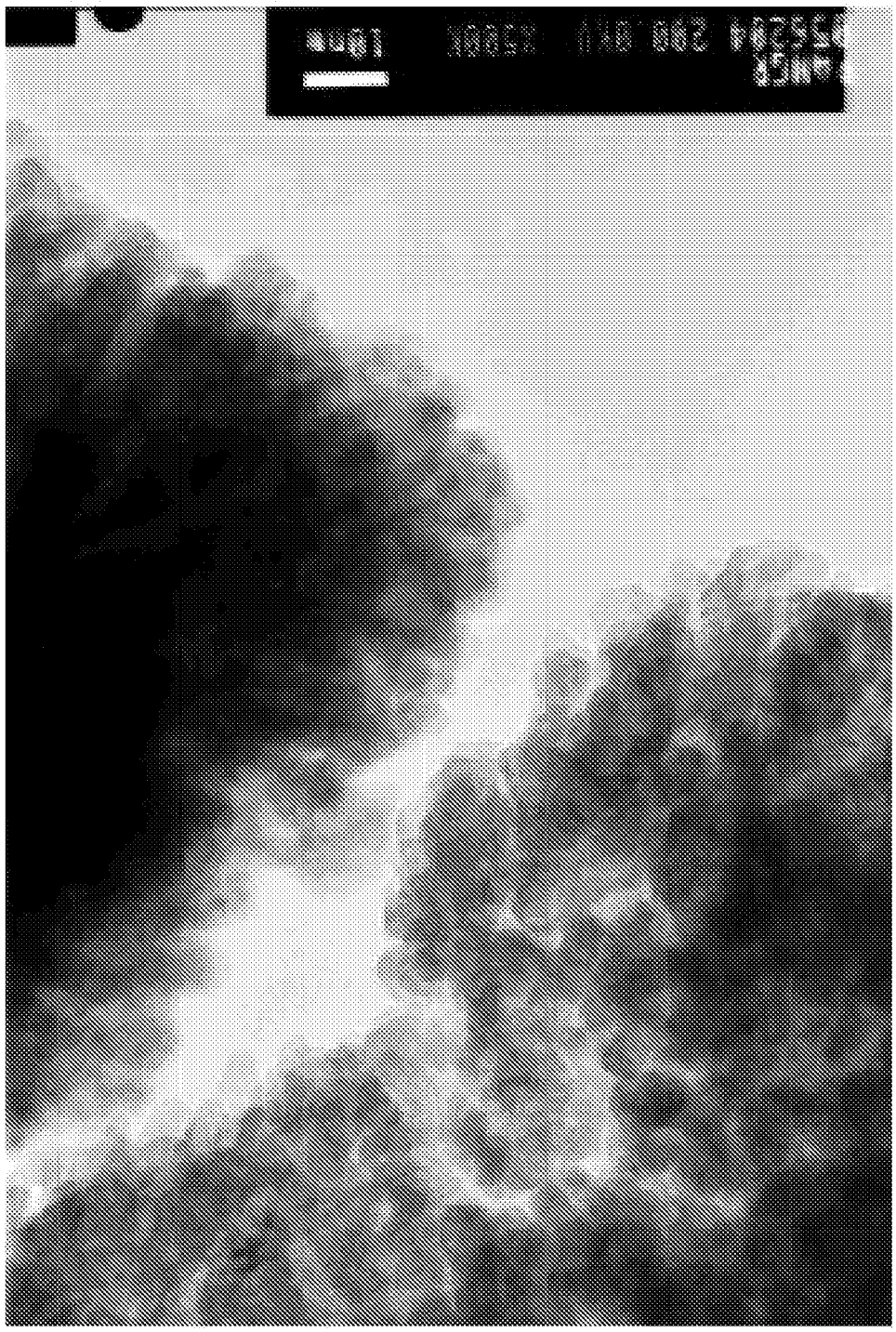
FIG. 14 illustrates a transmission electron microscope photo of the grains composing the nanobasket.

FIG. 14 shows the nanograins that compose the walls and cap of the nanobasket. The fact that the nanobasket architecture itself contains a substructure of nanograins is expected to further enhance the performance of the nanobaskets.

Initial research indicates that the method is robust and can be generalized to many materials of technological importance. Current research has focused on metallic oxides, such as $SnO_2$, $LiCoO_2$, and $TiO_2$ for which nanobaskets would be of importance in photovoltaic and battery applications. Copper oxide nanobaskets are of importance in catalytic operations. Metal alloys, such as Nichrome, are useful for the manufacture of thermal devices. Even materials such as hydroxyapatite, the mineral closest in composition to bone, are amenable to this technique and have been observed to form nanobaskets. These materials may have important applications as bone mimics and tissue scaffolding. Further research is being done in all of these areas.

The process of the present invention also allows the formation of nanobaskets of multiple compositions. The ability to create a layered structure is truly unique and allows for the straightforward and easy assembly of nanodevices using appropriate selections of materials; for example, current collectors, electrodes, and semiconductors or layered semiconductors.

A layered nanobasket system is made by sputtering a first material, but stopping the sputtering at some desired point before the walls have grown thick enough to form a cap. A second material can then be sputtered atop the first, continuing to extend the walls of the baskets upward. Sputtering of this second material can continue until capping occurs, or it can also be stopped at a desired point before the walls have grown together, and more layers can be added. Configurations of up to five layers have so far been demonstrated. The number of layers possible is dependant upon the materials and pore sizes used.

The nanobasket structures can be used as sputtered, remaining attached to the substrate, or may be removed from the substrate by appropriate mechanical or chemical methods.

The nanobasket structures can further be utilized by functionalization of their surfaces, attachment of additional catalytic materials, or by filling the pore spaces with a desired medium such as an electrolyte.

The nanobasket structures can undergo heat-treatment as necessary for a desired application.

The nanobasket structures and/or layers within them may be made from doped elements or compounds; for example, $SnO_2$ doped with indium.

An example of fabrication of a nanobasket from a single deposited material and from multiple compositions to form a layered cap follows:

Example 1 of Single-Component Fabrication Using $SnO_2$

An anodized aluminum oxide (AAO) substrate is placed on the sample stage of an RF-magnetron sputtering system which is fitted with a tin oxide ($SnO_2$) target. A chamber is filled and flushed with argon gas, and sputtering is initiated under system conditions of 0.01 mbar argon pressure and 35 watts forward power. In accordance with the generally recognized principles of sputter depositions, $SnO_2$ is removed from the target and deposited onto the AAO substrate. Film thickness is monitored using a quartz crystal thickness monitor. When the desired thickness is reached, turning off the power halts the sputtering process.

Example 2 of Layered Fabrication Using Gold (Au) and Lithium Carbonate ($LiCoO_2$)

An anodized aluminum oxide (AAO) substrate is placed on the sample stage of an RF-magnetron sputtering system which is fitted with a gold (Au) target. The chamber is filled and flushed with argon, and sputtering is initiated under system conditions of 0.01 mbar argon pressure and 35 watts forward power. In accordance with the generally recognized principles of sputter depositions, gold is removed from the target and deposited onto the AAO substrate. Film thickness is monitored using a quartz crystal thickness monitor. When the desired thickness is reached, sputtering is halted and the chamber is opened. A new target of $LiCoO_2$ is installed. The chamber is again filled and flushed with argon, and sputtering is initiated under system conditions of 0.01 mbar argon pressure and 35 watts forward power. $LiCoO_2$ is removed from the target and deposited onto the gold layer previously deposited on the AAO substrate. Film thickness is monitored using a quartz crystal thickness monitor. When the desired thickness is reached, turning off the power halts the sputtering process.

The nanostructures fabricated by the teachings of the present invention may be used in numerous applications.

FIGS. 4, 5, 6 and 7 illustrate simplified diagrammatic views of the sequential fabrication of capped nanostructures by sputter deposition utilizing multiple compositions.

Figure 4:
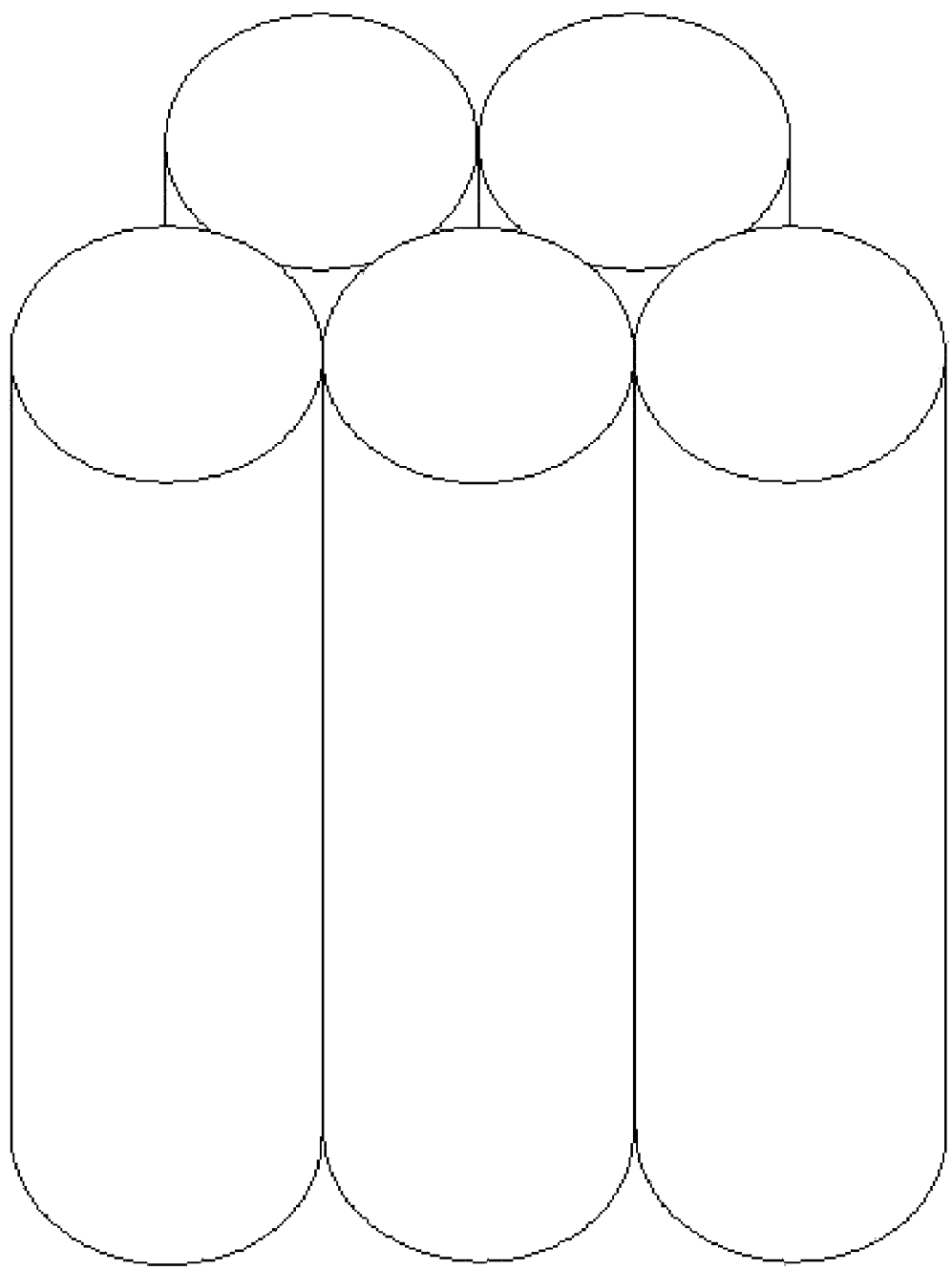
FIG. 4 illustrates a simplified, diagrammatic view of the fabrication or formation of capped tubes utilizing multiple compositions to create a layered structure.
Figure 5:
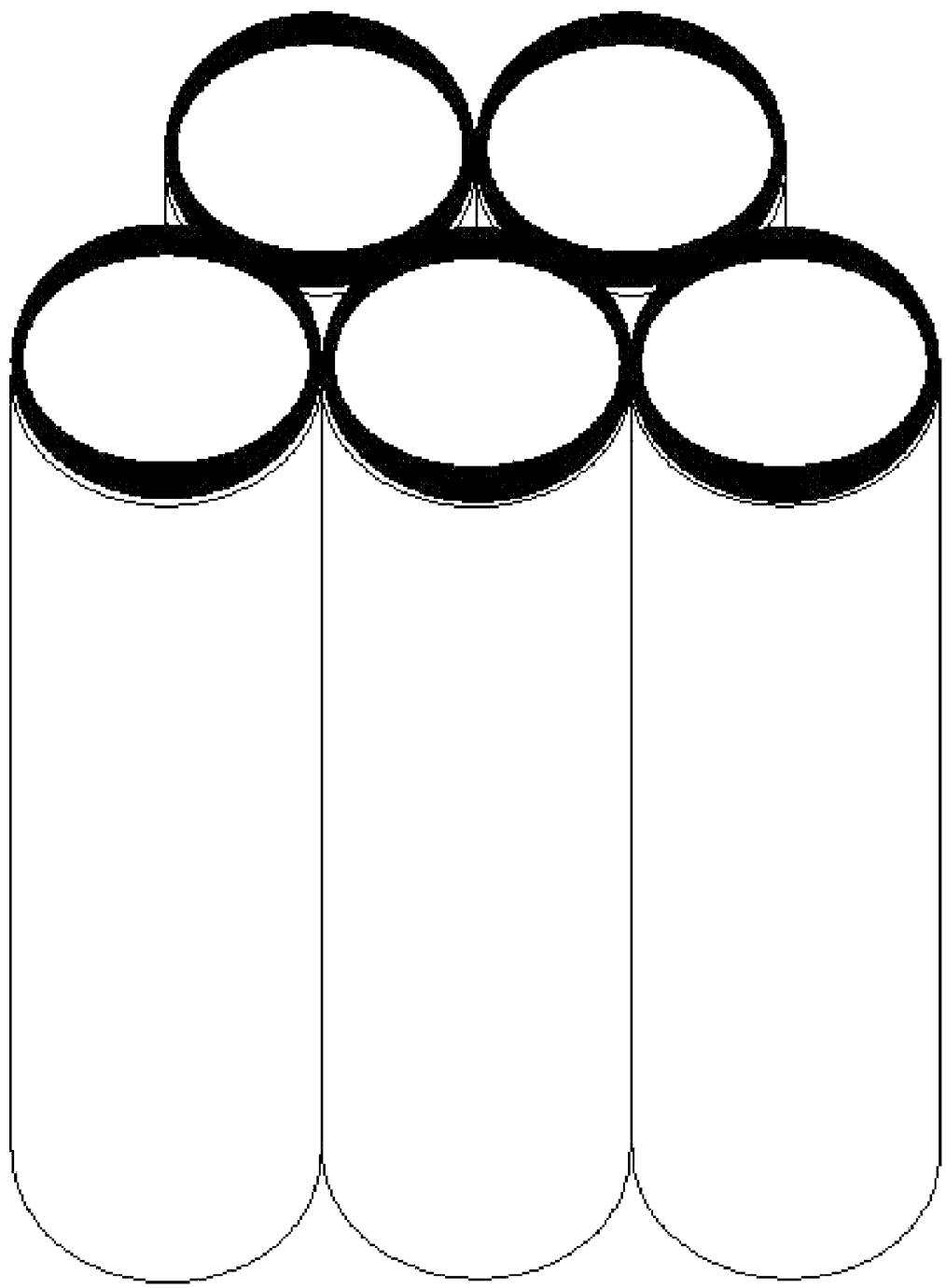
FIGS. 5, 6 and 7 illustrate subsequent, sequential stages in the formation of capped tubes of multiple compositions.

FIG. 4 illustrates the pores of the substrate prior to application of any sputter deposition. FIG. 5 illustrates use of sputter deposition techniques to apply a metallic deposit onto the edges or open ends of the nanotube structures.

Figure 6:
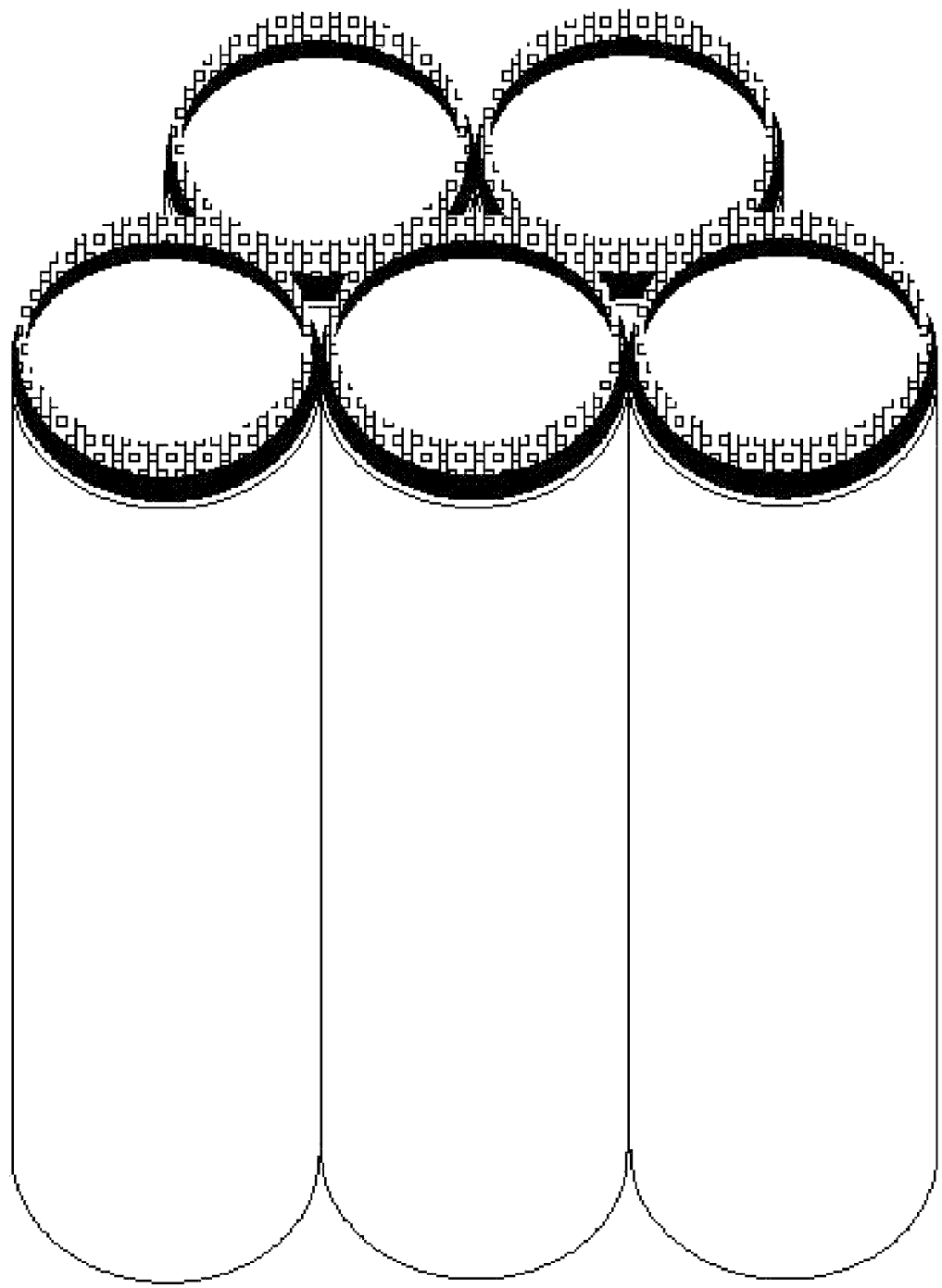
Figure 7:
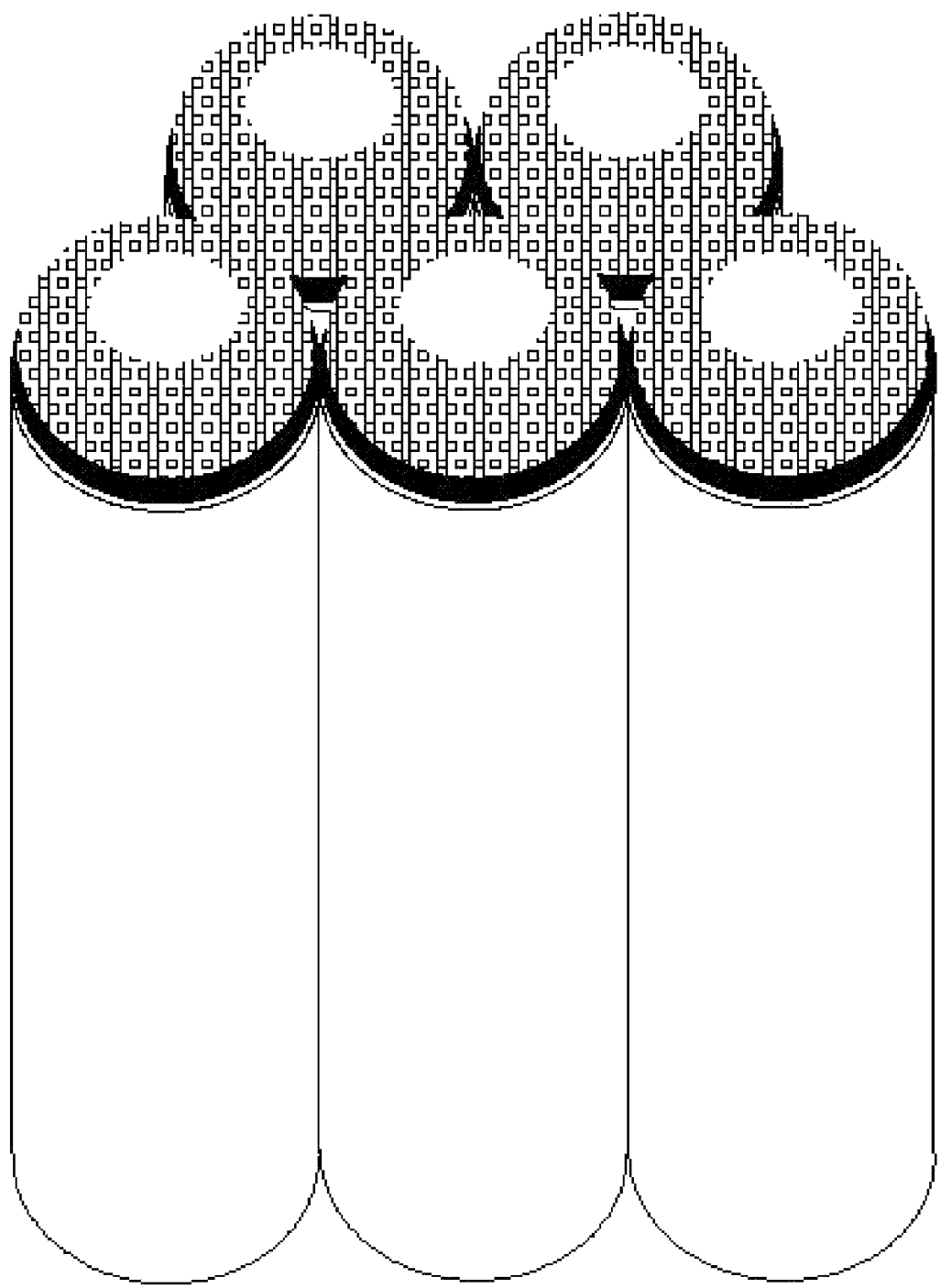

FIGS. 5, 6 and 7 illustrate the sequential application of a metallic oxide onto the metal layer previously deposited on the nanotube structure. As will be observed, continued application of the metallic oxide results in the capping over of the tubes.

Photovoltaic Device

Figure 10:
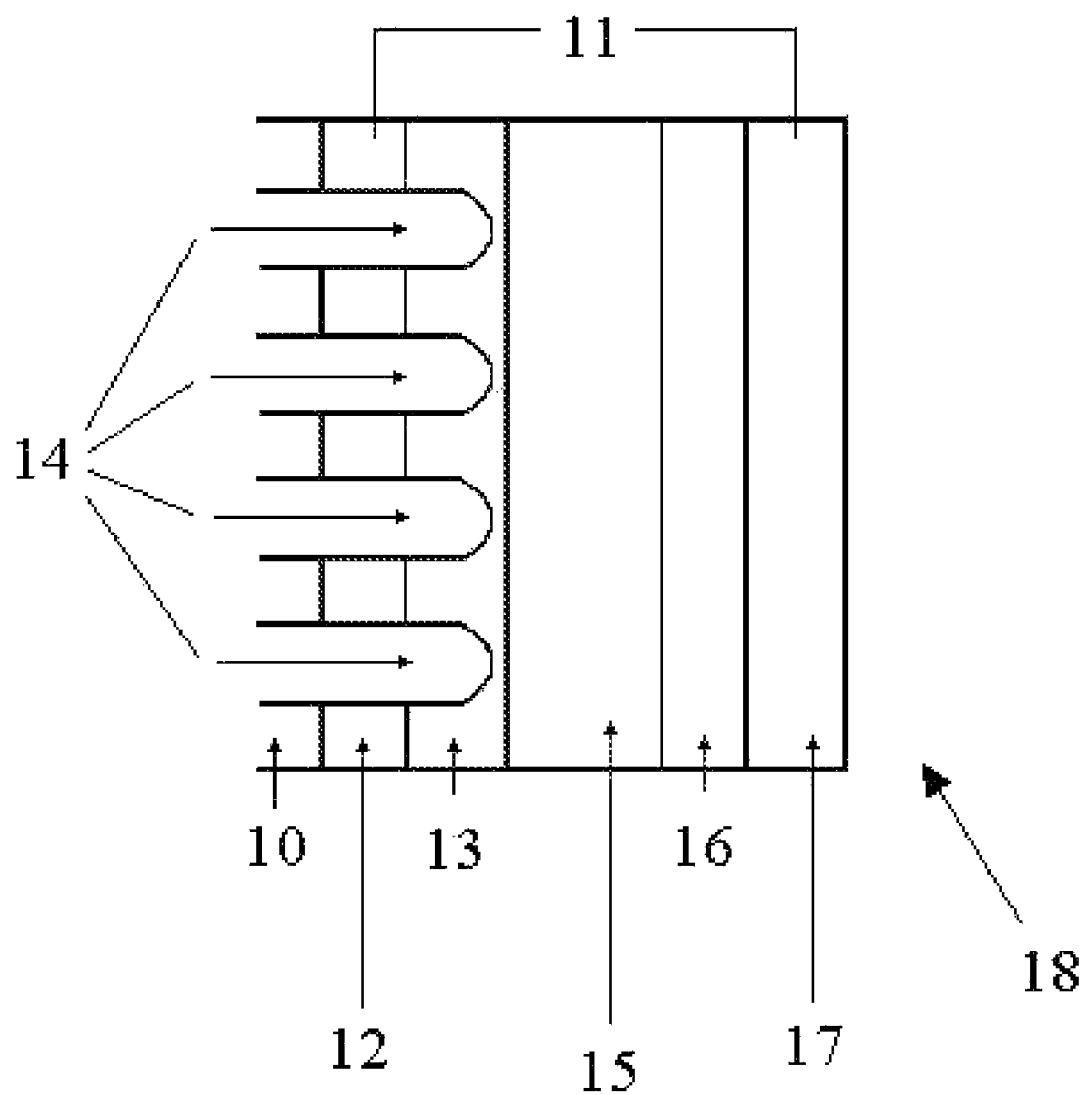
FIGS. 10 through 13 illustrate potential applications of the present invention.

The second concept involves using these nanostructures to make photovoltaic devices 18 as shown in FIG. 10. In typical photovoltaic devices, a transparent current collector must be used so that light may pass through it for interaction with the photovoltaic material. Using the layered structure formation in concept (1), a new type of photovoltaic 18 could be manufactured. The photovoltaic 18 would be manufactured by first depositing 14 a conducting metal layer 12 on the nanoporous substrate 10. This layer will serve as a current collector 12. A second layer of a photoactive semiconductor (photovoltaic layer) 13 will be deposited and allowed to cap over. This structure is a very novel component for a photovoltaic device. It has been shown that nanoporous materials can serve as optical waveguides. (K. H. A. Lau, L.-S. Tan, K. Tanada, M. S. Sander, and W. Knoll, "Highly Sensitive Detection of Processes Occurring Inside Nanoporous Anodic Alumina Templates: A Waveguide Optical Study," *Journal of Physical Chemistry*, 108, 10812 (2004)) The size of the pores in the nanoporous substrate 10 can be of the appropriate size to interact with light such that they function as a waveguide. This will facilitate the passage of light 11 through to open pores of the noncoated side of the nanoporous substrate 10. This light will be able to pass through the pores in the nanoporous current collector 12 impinging on the capped photovoltaic material 13. The size of the pore and the curvature of the cap part of the nanobaskets could further accentuate the interaction of light by acting both as an additional waveguide and a lens, further focusing the light on the photovoltaic material 13 and enhancing performance. This would be a novel structure for a photovoltaic device. The completed photocell 18 would be constructed by placing an electrolyte 15, complementary electrode 16, and a second current collector 17, respectively on the capped side of the photovoltaic material 13.

Battery Systems

Figure 11:
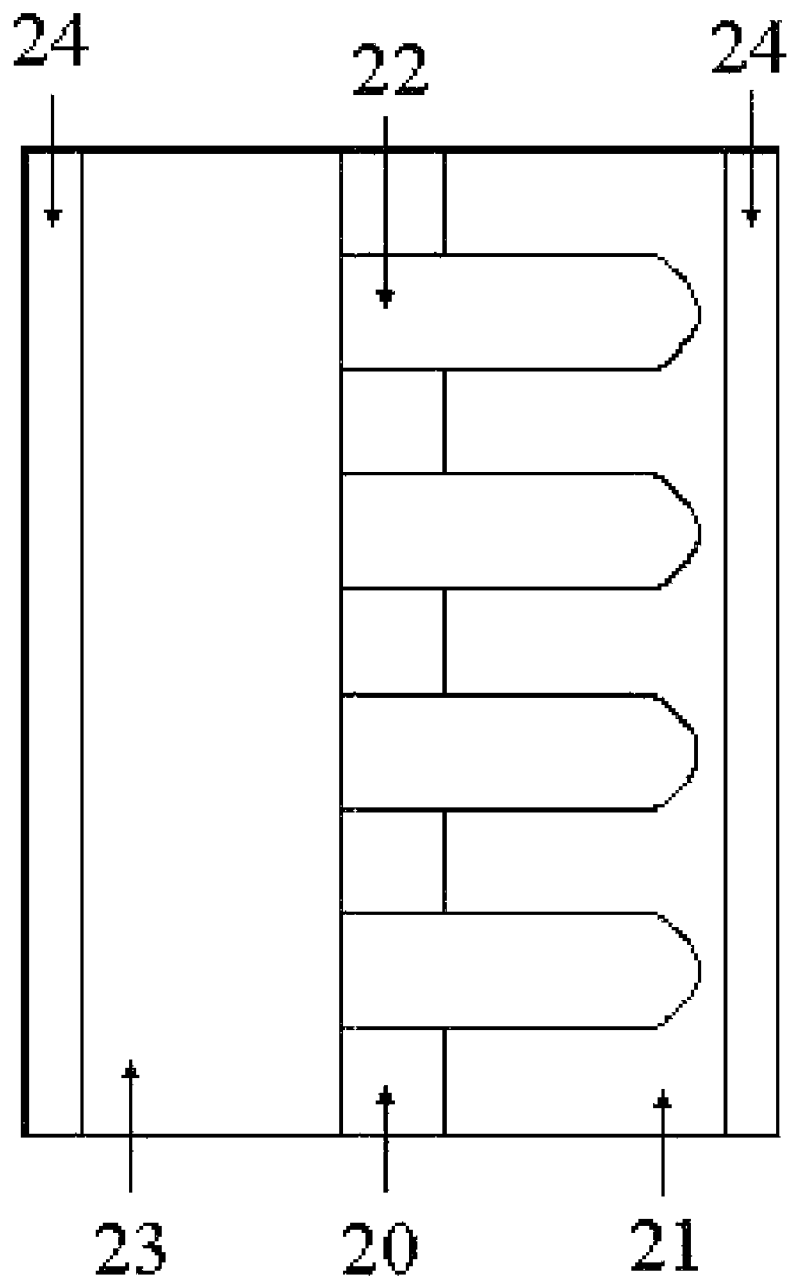

The third concept involves using a multilayered, nanobasket nanostructured material to make thin film battery systems as shown in FIG. 11. Again using the layered structure formation in concept (1), a layer of nanobaskets of an appropriate battery electrode material 21 are sputter-coated onto a nanoporous substrate 20. The nanoporous substrate 20 and the nanobaskets 21 are filled with electrolyte 22 using capillary action to "pull" the electrolyte into the pores (as described in Assignee's U.S. Pat. No. 6,586,133) or other techniques. The opposite side of the nanoporous substrate 20 would still have pores that are open, but filled with electrolyte 23. One configuration of the battery would now cover this end of the substrate with an appropriate electrode material forming a battery. Placing the electrode 23 on this side could be done by many methods including sputter-coating, spreading of pastes of composite electrode materials, etc. A current collector 24 would be affixed to this electrode 23. This thin film battery would have increased performance because of the increased surface area of the nanobasket electrode and because of the enhanced performance of electrolyte materials confined in nanoporous materials. (Seshumani Vorrey and Dale Teeters, "Study of the Ion Conduction of Polymer Electrolytes Confined in Micro and Nanopores," *Electrochimica Acta*, 48, 2137 (2003))

Figure 12:
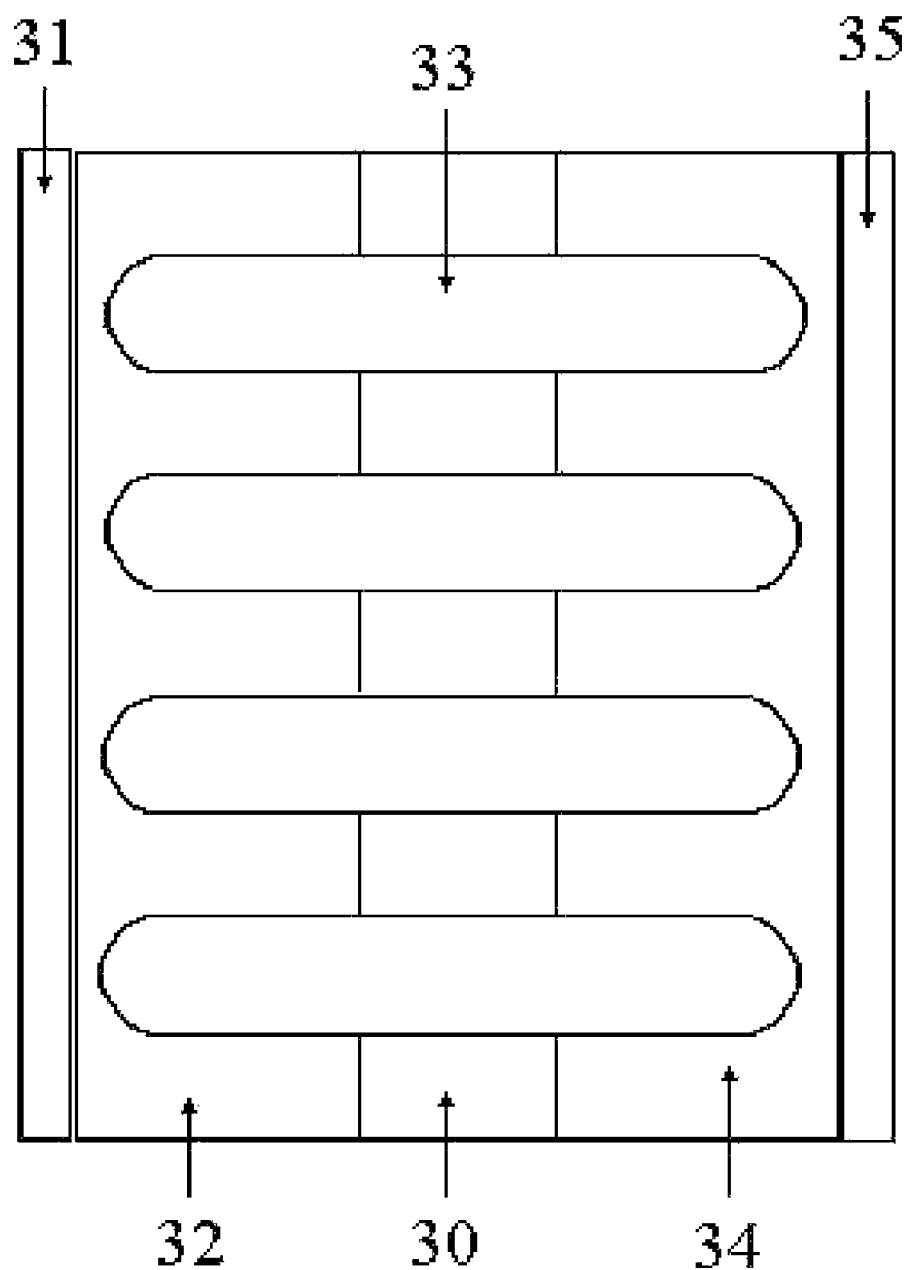

A second battery configuration as depicted in FIG. 12 would consist of first placing a layer of current collecting material 31, such as a metal, by sputter-coating on the nanoporous substrate 30. This current collecting layer 31 is capped with nanobaskets 33 of an appropriate battery electrode material. Using capillary action to "pull" the electrolyte into the pores (as described in Assignee's U.S. Pat. No. 6,586, 133) or another appropriate technique, both the pores of the substrate 30 and those in the current collector 31 and the nanobaskets 33 are filled with electrolyte 32. The opposite side of the nanoporous substrate would still have pores that are open, but filled with electrolyte 34. Deposition of the complementary electrode 35 would again be done by using sputter-coating. Because of the nanoporous substrate 33, a nanobasket electrode layer 34 would be formed. This configuration would benefit from having two electrodes 32 and 34 both having a nanobasket configuration. This thin film battery would have increased performance because of the increased surface area of both of the nanobasket electrodes 32 and 34 and because of the enhanced performance of electrolyte materials confined in nanoporous materials. (Seshurnani Vorrey and Dale Teeters, "Study of the Ion Conduction of Polymer Electrolytes Confined in Micro and Nanopores," *Electrochimica Acta*, 48, 2137 (2003))

Figure 13:
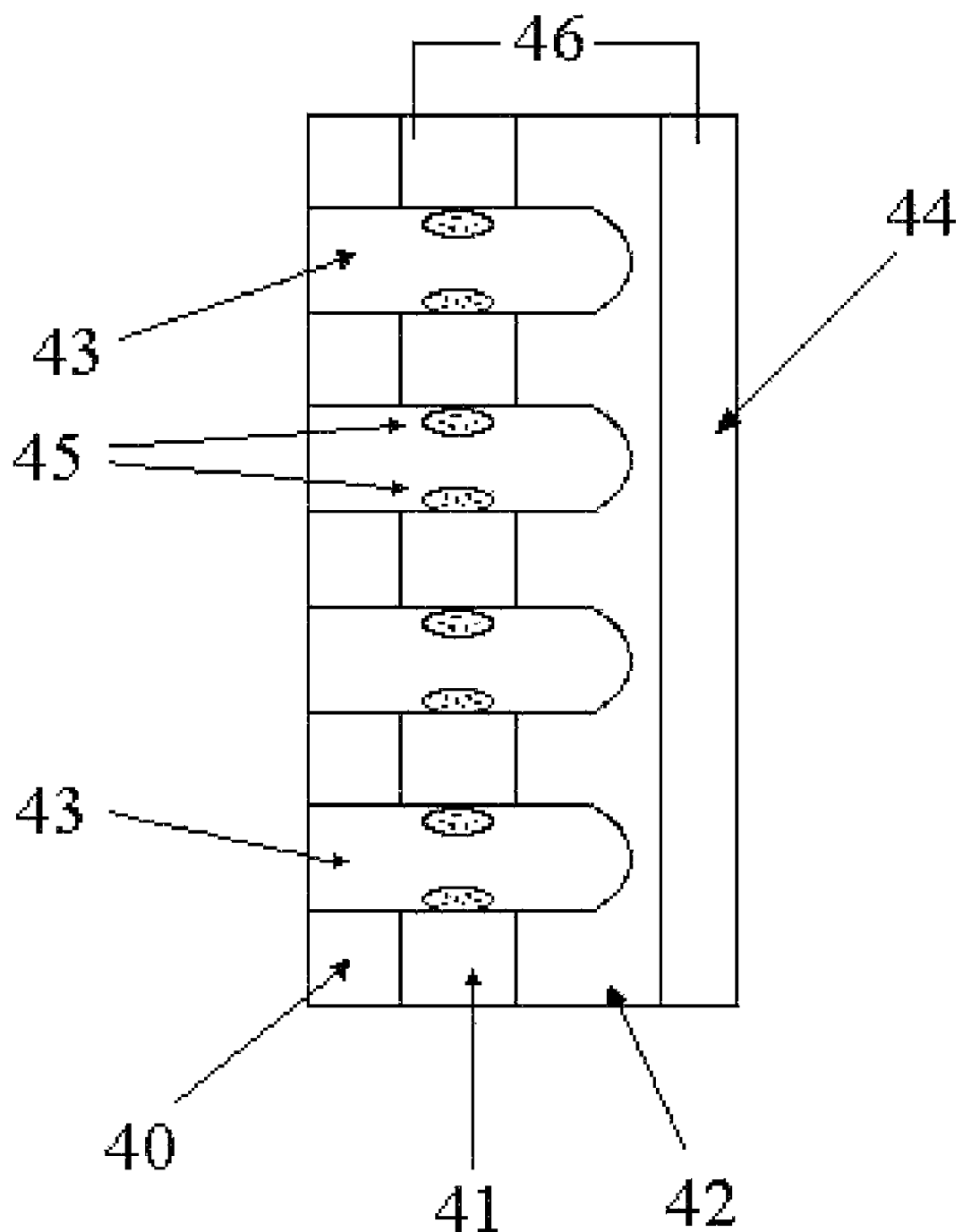

As shown in FIG. 13, another configuration would allow the in situ formation of a battery anode in a nanostructured thin film battery. This configuration consists of first depositing a first layer of current collecting material 41 by sputter-coating on a nanoporous substrate 40. This layer 41 is not allowed to cap. This current collecting layer 41 is then capped with nanobaskets 42 of an appropriate battery cathode material by deposition by sputter-coating. This material must contain metal ions of the same composition of the anode desired to be formed. By using capillary action to "pull" the electrolyte into the pores (as described in Assignee's U.S. Pat. No. 6,586,133) or other appropriate techniques, the pores of the substrate 40 and those in the current collector 41 and the nanobaskets 42 can be filled with electrolyte 43. A second current collector 44 would be placed on top of the nanobasket electrode layer 42. The opposite side of the nanoporous substrate would still have pores that are open, but fled with electrolyte 43. At this point a thin film battery could be formed by in situ deposition of an anode 45. The "in-situ" formation of an electrode has been described in the literature. (B. J. Neudecker, N. J. Dudney, and J. B. Bates, "Lithium-Free Thin-Film Battery with In Situ Plated Li Anode," *Journal of the Electrochemical Society*, 147 517 (2000)) This technique is applied to our nanostructured system by applying an appropriate current 46 to the two current collectors 41 and 44 drawing metal ions from the cathode layer 42 and through the electrolyte 43 present in the nanopores. This will result in electrochemical plating of the metal anode 45 onto the current collector 41 that closest to the nanobasket openings. This plated metal would be the anode 45 formed in situ. Since this anode 45 would be in very close proximity to the nanobasket 42, cathode material, it would enhance performance. Since the anode 45 is deposited in situ and is not exposed to air, the anode 45 is less likely to be degraded by air exposure, this eliminating a major problem in the development of thin-film lithium batteries. Once again, this thin film battery would also have increased performance because of the increased surface area of the nanobasket electrode and because of the enhanced performance of electrolyte materials confined in nanoporous materials. (Seshumani Vorrey and Dale Teeters, "Study of the Ion Conduction of Polymer Electrolytes Confined in Micro and Nanopores," *Electrochimica Acta*, 48, 2137 (2003))

A further concept involves using these nanostructured materials as catalytic and reactive devices. It is well-known that chemical reactivity increases as surface area increases. Research into methods of increasing nanoscale surface area of catalytic materials, therefore, is wide-ranging and intense. Formation of nanobaskets is a new route to enhanced surface area at the nanoscale. For example, $SnO_2$ is already in wide use as the sensing material in gas sensors. It is believed that sensor sensitivity can be increased by providing more surface sites for gas adsorption. (Y. Wang, et. al., Solid-State Electronics, 48 (2004) 627-632) Formation of $SnO_2$ nanobaskets would be a new route to a high-surface area gas sensor. Nanoporous structures are also required for the catalytic activity of fuel cells. The method described here would be a new route to a novel nanoporous structure.

A further concept involves using these nanostructured materials in optoelectronic devices; a varied group of systems which modulate optical properties in response to electrical changes, or vice versa. Some of the materials in which nanobasket formation has been observed are already of use in this field due to their unique reflectance, transmittance, and photoluminescence characteristics. For example, $SnO_2$ has been proposed as a prospective material for in modulated electrochromic devices which can reversibly change their transmission when a voltage is applied. (P. Olivi, et al., *J. Electrochem. Soc. L*81 (1993) 140) Thin films of ZnO are used in light emitting diodes and diode lasers, and nanostructured films of ZnO have been shown to have optical properties influenced by the template on which they are fabricated. (Z. Fang, et al., Materials Letters, 57 (2003) 4187-4190) Since the nanobaskets are a new nanostructure, investigation of their interaction with light may well show them to have unique and useful properties in such devices. The porous substrate on which they are fabricated could be used to add to the uniqueness of these devices by serving as a wavelength guide through which photons must pass before striking the nanobasket structure itself.

A further concept involves the application of nanostructured hydroxyapaptite films. Hydroxyapatite is the mineral closest in composition to bone. Thin films of hydroxyapatite deposited onto medical and dental implants are widely used in both orthopaedic and dental surgery. (L. Sun, et. al., J. Biomed Mater Res 58 (2001) 570) Traditional coating methods, however, have poor control of porosity, pore shape, and topography. Formation of nanobaskets provides a new route to reproducible, high surface area hydroxyapatite coatings, with an associated potential increase in successful implantation.

There is also a wide body of research into the creation of artificial cell scaffoldings for in-vitro bone cell growth. Highly porous scaffolds are needed to allow nutrients and metabolites to permeate, and to serve as a guide for cell growth and new bone tissue formation in three directions. It has been shown that scaffolds containing hydroxyapatite provide osteoblasts with more favorable environments and are more suitable for bone tissue engineering. (P. X. Ma, et. al. Department of Biologic and Materials Sciences, University of Michigan, Ann Arbor, Mich., USA. Abstracts of Papers, 222nd ACS National Meeting, Chicago, Ill., United States, Aug. 26-30, 2001) Currently proposed scaffolds are composites of hydroxapatite and polymers. Nanobasket formation is a unique route to a highly porous, three-dimensional scaffold composed solely of hydroxyapatite.

Whereas, the present invention has been described in relation to the drawings attached hereto, it should be understood that other and further modifications, apart from those shown or suggested herein, may be made within the spirit and scope of this invention.

What is claimed is:

1. A method of producing a nanobasket, said method comprising:
    providing a substrate having at least one pore having a diameter of from about 1 nm to about 10 micrometers; and
    depositing at least one material along a continuous edge of said pore to form a capped or partially capped nanotube or microtube structure over said pore.

2. A method of producing a nanobasket as set forth in claim 1 wherein said substrate includes a plurality of said pores.

3. A method of producing a nanobasket as set forth in claim 1 wherein said substrate is a conducting, non-conducting or semi-conducting material.

4. A method of producing a nanobasket as set forth in claim 3 wherein said substrate is at least one of solid oxide, polymeric, ceramic, mineral or metallic materials.

5. A method of producing a nanobasket as set forth in claim 4 wherein said substrate is a polycarbonate, carbon, silica, silicon or alumina material.

6. A method of producing a nanobasket as set forth in claim 1 wherein said step of depositing a material is accomplished by sputter-coating, chemical vapor deposition or pulsed laser method.

7. A method of producing a nanobasket as set forth in claim 6 wherein said step of sputter-coating includes direct current sputter-coating, radio frequency sputter-coating, magnetron sputter-coating and reactive sputter-coating.

8. A method of producing a nanobasket as set forth in claim 1 wherein said material deposited is a conducting, non-conducting or semi-conducting material.

9. A method of producing a nanobasket as set forth in claim 8 wherein said material deposited is an oxide, polymeric, ceramic, mineral or metallic material.

10. A method of producing a nanobasket as set forth in claim 9 wherein said material deposited is selected from the group consisting of tin oxide, lithium cobalt oxide, zinc oxide, copper oxide, titanium oxide, titanium dioxide, vanadium pentoxide, magnesium oxide, silicon dioxide, carbon, silicon, nichrome, and hydroxyapatite.

11. A method of producing a nanobasket as set forth in claim 1 including an additional step of depositing at least one additional material to form a layered nanobasket structure.

12. A nanobasket comprising:
    a nanoporous substrate having at least one pore in said substrate, each of said pores having a continuous edge at a surface of said substrate; and
    a capped or partially capped nanotube or microtube structure fabricated from clusters of material deposited on said continuous edge of said substrate.

13. A nanobasket as set forth in claim 12 wherein said substrate includes a plurality of said pores.

14. A nanobasket as set forth in claim 12 wherein said substrate is a conducting, non-conducting or semi-conducting material.

15. A nanobasket as set forth in claim 12 wherein said substrate is at least one of solid oxide, polymeric, ceramic, mineral or metallic materials.

16. A nanobasket as set forth in claim 12 wherein said substrate is a polycarbonate, carbon, silica, silicon or alumina material.

17. A nanobasket as set forth in claim 12 including a means to deposit said clusters of material by sputter-coating, chemical vapor deposition or pulsed laser method.

18. A nanobasket as set forth in claim 12 wherein said material deposited is a conducting, non-conducting or semi-conducting material.

19. A nanobasket as set forth in claim 12 wherein said material deposited is an oxide, polymeric, ceramic, mineral or metallic material.

20. A nanobasket as set forth in claim 12 including at least one additional material to form a layered cap.

\* \* \* \* \*